United States Patent [19]
Eylon

[11] Patent Number: 5,867,590
[45] Date of Patent: *Feb. 2, 1999

[54] METHOD AND APPARATUS FOR DETERMINING A LOCATION ON A SURFACE OF AN OBJECT

[75] Inventor: Dan Eylon, Tel Aviv, Israel

[73] Assignee: Nova Measuring Instruments, Ltd., Rehovot, Israel

[ * ] Notice: This patent issued on a continued prosecution application filed under 37 CFR 1.53(d), and is subject to the twenty year patent term provisions of 35 U.S.C. 154(a)(2).

[21] Appl. No.: 590,054

[22] Filed: Jan. 11, 1996

Related U.S. Application Data

[63] Continuation-in-part of Ser. No. 512,731, Aug. 7, 1995, Pat. No. 5,682,242.

[30] Foreign Application Priority Data

Jan. 11, 1995 [IL] Israel .......................................... 112313

[51] Int. Cl.⁶ .................................................. G01B 11/00
[52] U.S. Cl. .............................................................. 382/151
[58] Field of Search ..................................... 382/145, 151; 437/8; 348/87, 95; 356/401, 378; 250/559.3

[56] References Cited

U.S. PATENT DOCUMENTS

| | | | |
|---|---|---|---|
| 4,328,553 | 5/1982 | Fredriksen et al. ....................... | 364/559 |
| 4,475,122 | 10/1984 | Green ........................................ | 348/87 |
| 4,780,615 | 10/1988 | Suzuki ...................................... | 250/548 |
| 4,823,012 | 4/1989 | Kosugi .................................... | 250/491.1 |
| 4,856,904 | 8/1989 | Akagawa ................................. | 356/400 |
| 4,918,320 | 4/1990 | Hamasaki et al. ....................... | 250/548 |
| 4,962,423 | 10/1990 | Yamada et al. .......................... | 358/101 |
| 4,969,116 | 11/1990 | Wada et al. .............................. | 364/578 |
| 5,037,771 | 8/1991 | Lipp .......................................... | 437/51 |
| 5,238,354 | 8/1993 | Volovich .................................. | 414/779 |
| 5,241,266 | 8/1993 | Ahmad et al. ....................... | 324/158 R |
| 5,274,575 | 12/1993 | Abe ........................................ | 364/559 |
| 5,737,441 | 4/1998 | Nishi ....................................... | 382/151 |

FOREIGN PATENT DOCUMENTS 61-277003 12/1986 Japan .
62-065436 3/1987 Japan .

*Primary Examiner*—David K. Moore
*Assistant Examiner*—Brian Werner
*Attorney, Agent, or Firm*—Skjerven, Morrill, MacPherson, Franklin & Friel LLP

[57] ABSTRACT

The present invention provides a method for determining a location on an object without prealignment and for positioning an object, such as a semiconductor, which has an array of generally perpendicular grid lines on its surface and a plurality of directional features. According to one embodiment the method determines the directions for the grid lines relative to the direction of a reference coordinate system, detects a grid junction and detects a direction of a reference coordinate system, detects a grid junction and detects a direction of one of the plurality of directional features, thereby providing a location of the grid junction in the reference coordinate system. According to an alternative embodiment, the method includes the steps of determining the directions of the grid lines relative to the direction of a reference coordinate system, detecting an asymmetrical directional feature, its orientation with respect to the directions of the grid lines and the distance of the asymmetrical feature from a geometrical center of the surface being known; and detecting a direction of the asymmetrical directional feature, thereby providing a location of the asymmetrical feature in the reference coordinate system. The object is positioned in accordance with the provided location of the grid junction.

18 Claims, 4 Drawing Sheets

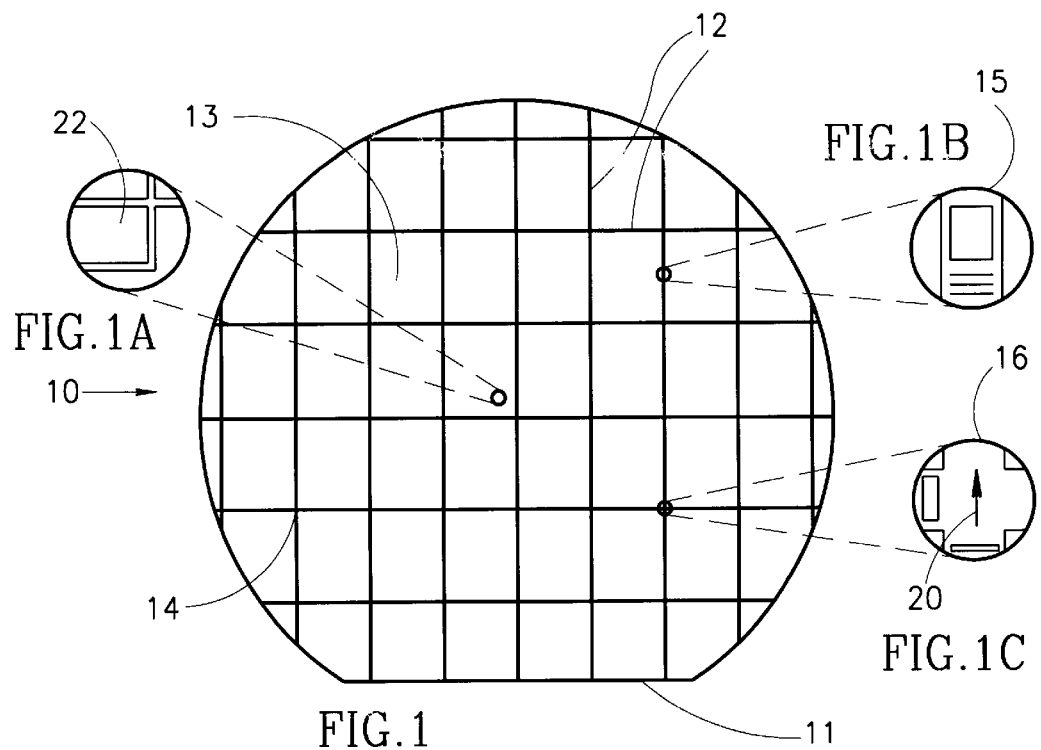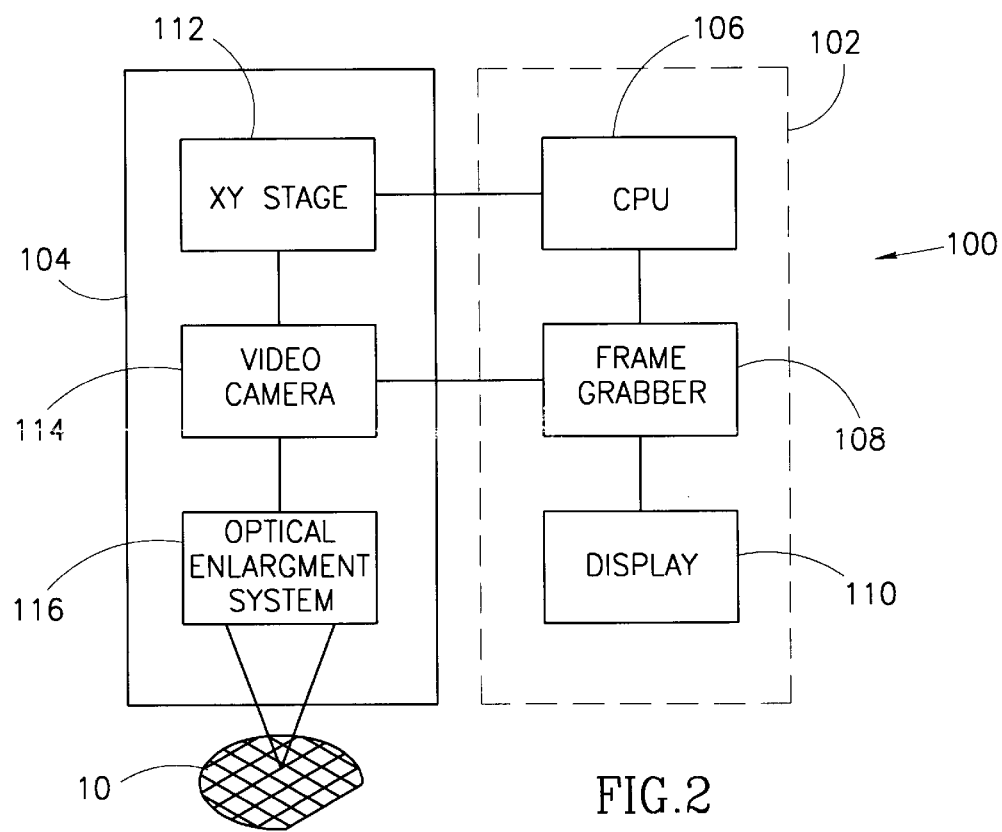

METHOD AND APPARATUS FOR DETERMINING A LOCATION ON A SURFACE OF AN OBJECT

CROSS REFERENCE TO RELATED APPLICATIONS

This application is a Continuation-In-Part of U.S. Ser. No. 08/512,731 filed Aug. 7, 1995, U.S. Pat. No. 5,682,242.

FIELD OF THE INVENTION

The present invention relates to system and method for determining a location on the surface of an object generally, and more particularly to system and method for determining a location on a semiconductor wafer.

BACKGROUND OF THE INVENTION

As is well known in the art, semiconductor chips, such as computer chips, are manufactured such that they include a substrate, typically a silicon wafer. It is often desired during the manufacturing process of silicon wafers to determine a location on the wafer for various purposes, such as quality control and subsequent cutting of the wafer into individual chips.

Silicon wafers, such as the ones manufactured by Intel Inc. or by International Business Machines (IBM) both of the USA, typically include discrete geometrical features and markings thereon, as shown in FIG. 1 to which reference is now made. FIG. 1 illustrates a silicon wafer, generally referenced 10, which is generally circular but includes a flat edge 11 or a notch (not shown) in one side thereof.

Prior art methods for determining the orientation of a silicon wafer typically include the step of detecting, by employing a sensor, the limits of the flat 11 or of the notch of the silicon wafer while the wafer rotates on a stage. These methods are both time consuming and require that the circumference of the wafer, or at least the side of the flat or the notch facing the sensor, will be unobscured. Furthermore, they are not applicable when the stage cannot be rotated.

SUMMARY OF THE INVENTION

It is an object of the present invention to provide an improved system and method for determining a location on a surface of an object, preferably a silicon wafer.

Further, it is an object of the present invention to provide an improved system and method for positioning an object, preferably a silicon wafer.

The objects of the present invention may be achieved by employing geometric features on the surface of an object, such as the features usually available on silicon wafers.

There is thus provided, in accordance with a preferred embodiment of the present invention a method for determining a location on an object having on its surface an array of generally perpendicular grid lines and a plurality of directional features. The method includes the following steps:

a. determining the directions of the grid lines relative to the direction of a reference coordinate system;

b. detecting a grid junction, the distance of the grid junction from the geometrical center of the surface being known; and c. detecting a direction of one of the plurality of directional features, thereby providing a location of the grid junction in the reference coordinate system.

There is also provided, in accordance with a preferred embodiment of the present invention a method for positioning an object having on its surface an array of generally perpendicular grid lines and a plurality of directional features. The method includes the following steps:

a. determining the directions of the grid lines relative to the direction of a reference coordinate system;

b. detecting a grid junction, the distance of the grid junction from the geometrical center of the surface being known;

c. detecting a direction of one of the plurality of directional features, thereby providing a location of the grid junction in the reference coordinate system; and d. positioning the object in accordance with the provided location of the grid junction.

There is also provided, in accordance with a preferred embodiment of the present invention a method for determining a location on an object. The object has on its surface an array of generally perpendicular grid lines and at least one asymmetrical directional feature. The method includes the following steps:

a. determining the directions of the grid lines relative to the direction of a reference coordinate system;

b. detecting an asymmetrical directional feature, its orientation with respect to the directions of the grid lines and the distance of the asymmetrical feature and from a geometrical center of the surface being known; and c. detecting a direction of the asymmetrical directional feature, thereby providing a location of the asymmetrical feature in the reference coordinate system.

In addition, there is also provided, in accordance with a preferred embodiment of the present invention a method for positioning an object, the object having on its surface an array of generally perpendicular grid lines and at least one asymmetrical directional feature. The method includes the following steps:

a. determining the directions of the grid lines relative to the direction of a reference coordinate system;

b. detecting a directional asymmetrical feature, the distance of the asymmetrical feature from a geometrical center of the surface being known;

c. detecting a direction of the asymmetrical directional feature, thereby providing a location of the asymmetrical feature in the reference coordinate system; and d. positioning the object in accordance with the provided location of the asymmetrical directional feature.

Further, according to a preferred embodiment of the present invention the method includes, prior to the step of determining, the step of positioning the object on a support, the coordinate system of the support being the reference coordinate system, generally with the geometrical center of the surface coinciding with the origin of the support coordinate system, thereby assuring that the detected grid junction being one of grid junctions adjacent to the geometrical center of the surface.

Additionally, according to a preferred embodiment of the present invention the step of detecting the grid junction includes the following steps:

a. moving the optical assembly in a direction coincident with one direction of the grid lines until a grid line extending perpendicular to the direction of movement is detected; and b. moving along the detected grid line until a grid junction is detected.

Further, according to a preferred embodiment of the present invention the step of detecting the direction of the grid lines and the step of detecting the grid junction also include the step of employing a correlation function between a representation of the surface of the object and a representation of a reference thereto. The representation may be one dimensional or two dimensional.

Further, according to a preferred embodiment of the present invention the directional feature is in the grid junction and the step of moving to a different grid junction provided that the directional feature is not detected in that junction.

Finally, in accordance with a preferred embodiment of the present invention the object is a silicon wafer, the grid lines are scribe lines between dies of the silicon wafer and the grid junction is a scribe line intersection.

BRIEF DESCRIPTION OF THE DRAWINGS

The present invention will be understood and appreciated more fully from the following detailed description taken in conjunction with the appended drawings in which:

FIG. 1 is a schematic illustration of a prior art silicon wafer;

FIG. 2 is a schematic block diagram illustration of a system for positioning a silicon wafer constructed and operative in accordance with a preferred embodiment of the present invention;

DETAILED DESCRIPTION OF THE PRESENT INVENTION

Figure 3:
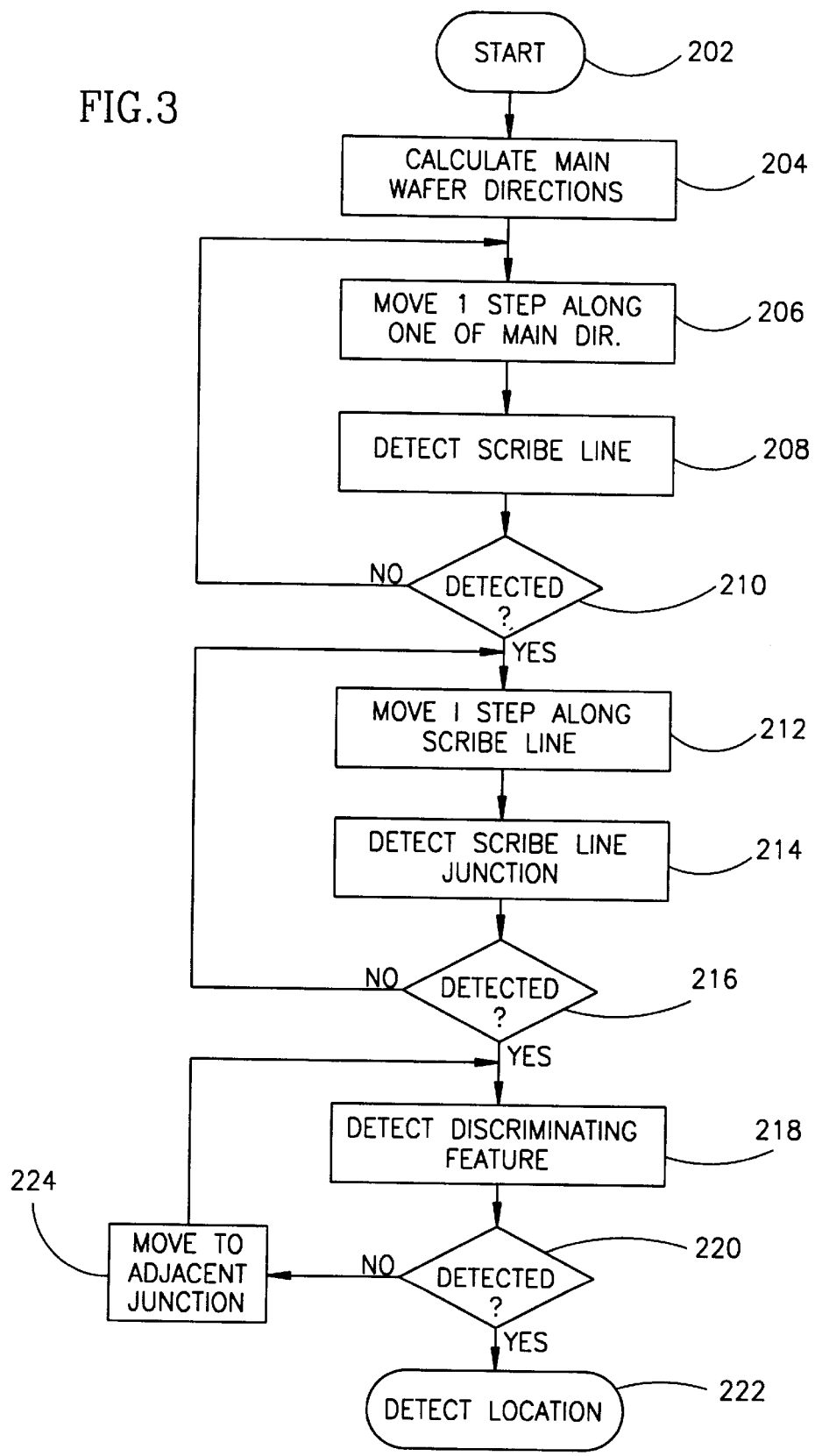
FIG. 3 is a flow chart illustration of a method for determining an exact location on a silicon wafer, in accordance with a preferred embodiment of the present invention.

The present invention provides a system and a method for determining a location on an object and a system and a method for positioning an object, such as a silicon wafer. The present invention employs geometric features on the surface of an object, such as the features usually available on silicon wafers as described in more detail hereinbelow.

As illustrated in FIG. 1, silicon wafers, such as the silicon wafer 10, typically include a grid of scribe lines 12 which are generally perpendicular therebetween. The silicon wafer will eventually be cut along the scribe lines into dies, such as the die 13, which are the individual chips obtained from the wafer. The scribe lines typically include markings thereon, such as the black square and three lines shown in the blow up illustration 15.

The junctions between two scribe lines, such as the junction 14, may also include a characteristic marking, such as the arrow 20 shown in the blow up illustration 16.

Silicon wafer 10 may also include at least one asymmetrical directional feature 22 on one or more of the dyes 13 and/or in one or more of the scribe lines 12 or junctions 14.

Reference is now made to FIG. 2 which is a schematic block diagram illustration of a system for positioning a silicon wafer constructed and operative in accordance with a preferred embodiment of the present invention. The system, generally referenced 100, comprises a computer 102, such as a personal computer of the type manufactured by International Business Machines (IBM), and a moving optical assembly 104.

The computer 102 preferably includes a Central Processing Unit (CPU) 106, a frame grabber card 108, such as the CORTEX-I frame grabber card, manufactured and sold by Imagenation of Beaverton, Oreg., U.S.A, and a display 110.

Preferably, but not necessarily, the display 110 includes two displays, one for displaying input commands to the CPU 106 and a video display for displaying images.

The moving optical assembly 104 preferably includes an XY stage 112 to which a video camera 114 is connected and an optical enlargement system 116.

The optical enlargement system 116 preferably comprises a light source, such as a Xenon or a Halogen lamp, for illuminating the surface of the wafer 10, a microscope for providing a desired optical enlargement, such as a 10 fold enlargement, and a focusing assembly which moves the microscope away from or towards the wafer 10 in order to obtain a sharp focused image in the video camera 114.

The focusing assembly may also be connected to a motion system (not shown) by which the optical enlargement system 116 moves in order to obtain focus. The motion system may be controlled by the CPU 106.

According to one preferred embodiment of the present invention the system 100 operates to determine a desired location on a silicon wafer, such as the silicon wafer 10. An image of a selected portion of the silicon wafer 10, preferably of a relatively small area thereof, determined by the optical enlargement system is sensed by the video camera 114 and is provided to the CPU 106 via the frame grabber card 108. The CPU 106 analyzes the image and adjusts the position of the moving optical assembly 104 by moving the XY stage 112. The process, which is described in more detail hereinbelow, is then repeated until the desired location is found.

According to another preferred embodiment of the present invention, the system 100 operates to position the silicon wafer 10 in a desired position relative to any desired system such as a silicon wafer cutting system.

Reference is now made to FIG. 3 which is a flow chart illustrating a method for determining a desired location on a silicon wafer, in accordance with a preferred embodiment of the present invention. The flow chart of FIG. 3 illustrates a method of employing the system of FIG. 2, in accordance with a preferred embodiment of the present invention. The method typically provides a detection accuracy of about 1 micron.

In order to employ the method of FIG. 3, the wafer 10 is positioned, for example by a user, on the stage of the system 100. This manual positioning provides the center of the silicon wafer with an inaccuracy of about 1 millimeter with respect to its stage or to the moving optical assembly.

It will be appreciated that, unlike in prior art methods and systems, the silicon wafer according to the present invention need not be rotated. Also, its circumference may be partially obscured.

The moving optical assembly 104 is then positioned above the center of the wafer, and the method according to the present invention is initiated as indicated by block 202.

It is noted that the stage of the silicon wafer and the moving optical assembly preferably include a coordinate system. Preferably, the coordinate system is a Cartesian coordinate system having its origin coincident with the center of the stage.

According to the method of FIG. 3, the main directions of the silicon wafer 10, i.e. the direction of the scribe lines, are determined first (step 204), preferably relative to the stage coordinate system. The orientation may be expressed as an angle of rotation relative to the stage coordinate system.

The relative orientation of the scribe lines relative to the stage coordinate system may be determined by any suitable method which employs the fact that most of the elements on the wafer surface are bounded by lines which are generally straight and are generally parallel to the main directions of the silicon wafer 10.

According to a preferred embodiment of the present invention, a Hough transform is employed on the grabbed image to obtain the content of the lines at any selected direction, thereby to detect which lines are scribe lines.

Once the direction of the scribe lines is determined, the moving optical assembly 104 is moved one step at a time along one of the main directions of the scribe lines as indicated by the loop referenced 206, 208 and 210, until a perpendicular scribe line thereto is detected.

It will be appreciated that typically, since the silicon wafer is positioned in the center of the stage, though with the insufficient accuracy of about 1 millimeter, and since the distance travelled by the optical moving assembly 104 is known, it can be determined whether the detected scribe line is one of the four scribe lines adjacent to the center of the wafer.

The scribe line can be detected by any suitable method for detecting a known feature in an image, such as by employing a correlation function between the image of the silicon wafer surface and a reference image stored in the computer 102. Alternatively, since the sizes of the dies are generally similar and the widths of the scribe lines are generally similar, the correlation may be performed between an enhanced image displaying only lines having a width generally similar to that of the scribe lines with a similar reference image.

According to one preferred embodiment of the present invention, the correlation is performed between a one dimensional function representing the features of the silicon wafer surface and a reference function. To obtain the one dimensional function representing the two dimensional image, intensity values of pixels along lines on the silicon wafer having the general direction of the scribe lines are summed and averaged, thereby providing an averaged intensity values of each of the lines. The averaged intensity value is then plotted against the line location on a base line perpendicular thereto, thereby providing a one dimensional function of the image. The intensity values are the grey scale values of a grey level image or the Red, Green, Blue (RGB) values of a color image.

The method continues in step 212 by moving the optical moving assembly 104 along the detected scribe line to a location of scribe lines intersection, also termed a "junction" (step 214).

The location of the junction can be detected by employing a second correlation function between an image, preferably a zoomed image of the junction, and a similar reference image stored in the computer 102. Alternatively, or in addition thereto, the junction can be detected by employing the correlation function procedures described hereinabove on two perpendicular scribe lines and determining the intersection therebetween.

The junction detected is one of the four junctions adjacent to the geometrical center of the silicon wafer. In order to determine which of the four junctions has been detected (step 216), thereby providing an exact location on the silicon wafer, the optical moving assembly searches for a discriminating feature (step 218), such as the arrow 20 of the junction 16 (FIG. 1). Preferably, one of four adjacent junctions, i.e. one of the corners of a die includes a discriminating feature.

As indicated by the block 220, if a discriminating feature is detected, the wafer is oriented vis a vis the coordinate system as indicated by block as indicated by block 222. The optical moving assembly can be moved to any desired location on the silicon wafer.

If a discriminating feature is not detected, as indicated by the block 224, the optical moving assembly is moved to an adjacent junction until a discriminating feature is detected. The loop indicated by blocks 218 and 220 is then repeated until a discriminating feature is detected.

Figure 4:
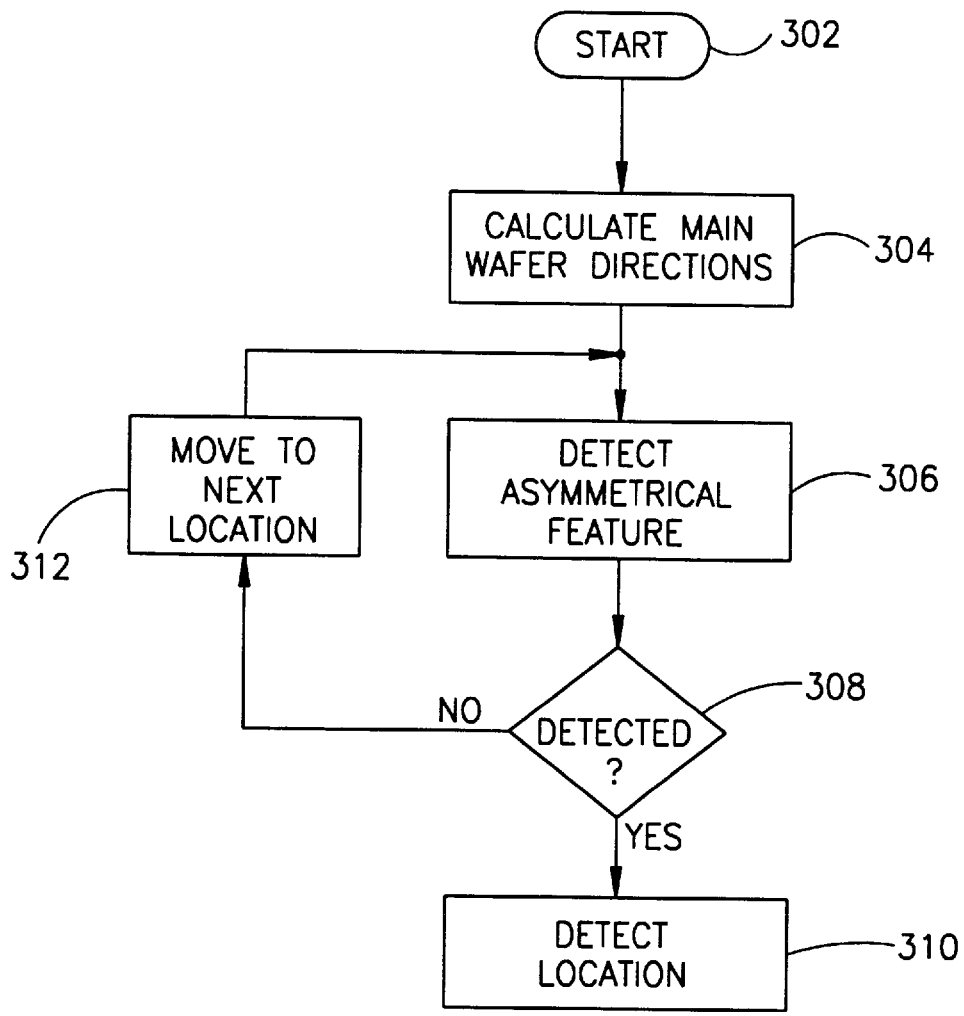
FIG. 4 is a flow chart illustration of a method for determining an exact location on a silicon wafer, in accordance with a second preferred embodiment of the present invention.
Figure 5A:
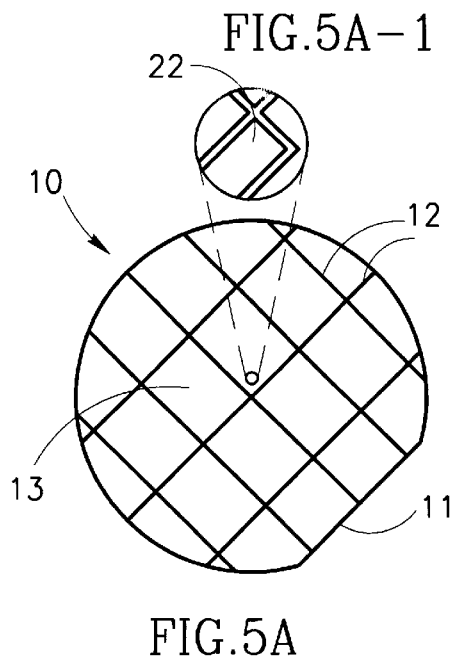
FIGS. 5A–5D are schematic illustrations of the silicon wafer of FIG. 1 in four different orientations.
Figure 5B:
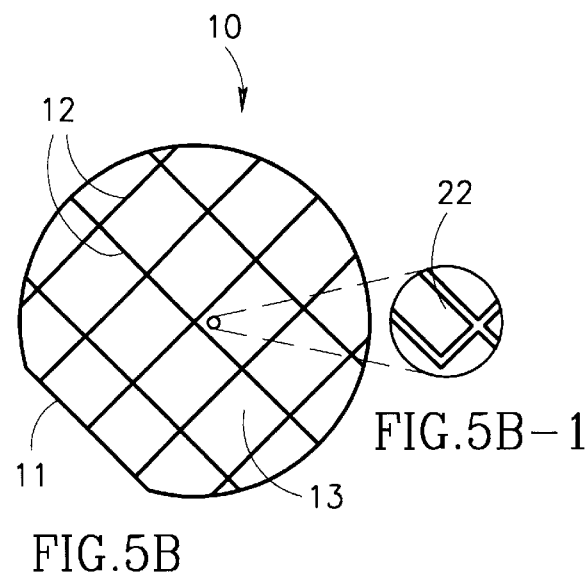
Figure 5C:
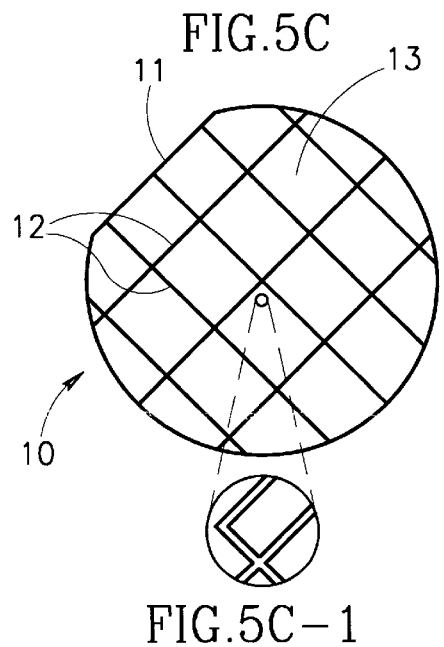
Figure 5D:
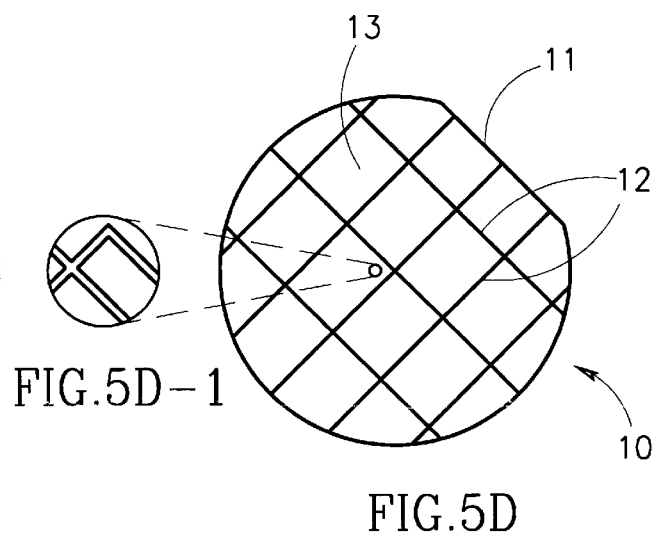

Reference is now made to FIG. 4 which is a flow chart illustrating a second method for determining a desired location on a silicon wafer, in accordance with another preferred embodiment of the present invention. The flow chart of FIG. 4 illustrates a method of employing the system of FIG. 2, in accordance with a second preferred embodiment of the present invention. The method typically provides a detection accuracy of about 1 micron.

In order to employ the method of FIG. 4, similarly to the method of FIG. 3, the wafer 10 is positioned, for example by a user, on the stage of the system 100. As described hereinabove, this manual positioning provides the center of the silicon wafer with an inaccuracy of about 1 millimeter with respect to its stage or to the moving optical assembly.

The moving optical assembly 104 is then positioned above the center of the wafer, and the method according to the present invention is initiated as indicated by block 302 which is similar to block 202.

According to the method of FIG. 4, the main directions of the silicon wafer 10, i.e. the direction of the scribe lines, are determined first as indicated by step 304, preferably relative to the stage coordinate system. The orientation may be expressed as an angle of rotation relative to the stage coordinate system.

Step 304 is similar to step 204 (FIG. 3), and the relative orientation of the scribe lines relative to the stage coordinate system may be determined by any suitable method as described in detail hereinabove with respect to the method of FIG. 3.

Once the direction of the scribe lines are determined, the moving optical assembly 104 (FIG. 2) is moved to one of four expected locations in which the directional asymmetrical directional feature 22 may be detected and an attempt to detect it in the selected location is made as indicated by step 306 and described in detail hereinbelow.

It will be appreciated that typically, since the silicon wafer is positioned in the center of the stage, though with the insufficient accuracy of about 1 millimeter, and since the distance travelled by the optical moving assembly 104 is known, it can be determined whether the detected asymmetrical directional feature 22 is in one of the four dyes adjacent to the center of the wafer.

It will be further appreciated that if the orientation of the asymmetrical directional feature 22 in its location is known as shown in FIGS. 5A–5D, detecting the asymmetrical feature 22 provides an absolute location on the wafer 10. The orientation of the asymmetrical directional feature 22 can be determined in any suitable way, such as by employing the optical assembly 104 prior to scan the wafer 10 and to store the orientation of the asymmetrical directional feature 22 with respect to the flat 11 without determining an exact location as described in the method illustrated by FIG. 4.

FIGS. 5A–5D illustrate the asymmetrical directional feature 22 in four different orientation with respect to the flat 11. FIGS. 5A–5D illustrate that once the asymmetrical directional feature is detected, its orientation with respect to the main directions of the wafer, i.e. the direction of the scribe lines is known and a single location on the wafer is defined.

The step 306 includes a search of the asymmetrical directional feature 22 in any suitable way, such as the two ways described hereinbelow. As indicated by step 308, if the asymmetrical directional feature 22 is detected, the exact location on the silicon wafer is provided as indicated by 310. If the asymmetrical directional feature 22 is not detected in a first location, the optical moving assembly 104 is moved to a second location as indicated by step 312.

The detection process is now repeated at steps 306 and 308 to detect the asymmetrical directional feature 22 and to provide an exact location at 310 or to continue the movement of the optical assembly 104 to a third location.

According to one preferred embodiment of the present invention, the optical assembly 104 is moved to a single position in each location, the steps of detection 306 and 308 are performed and if not successful the process continues in 312, i.e., the steps 306, 308 and 312 are repeated after the directional asymmetrical feature 22 is searched in every possible location once. The cycle continues until the asymmetrical feature 22 is detected in one of the four expected locations wherein for each location one attempt for detecting the feature 22 is made per cycle.

Alternatively, the search for the feature in each location includes a search in a plurality of locations in the vicinity of the expected location of the asymmetrical directional feature 22, i.e., the steps 306 and 308 include the step of moving the optical assembly 104 between a plurality of positions within a single location in order to detect the asymmetrical directional feature 22. The loop ends at 310 if asymmetrical directional feature 22 is detected or continues at 312 to a second location. The search is then repeated for the second location, and if the asymmetrical directional feature 22 is not detected, the method similarly continues to the third and if necessary the fourth expected location of the asymmetrical directional feature 22.

It will be appreciated that the embodiment described with respect to FIG. 4 is advantageous since an absolute location on wafer 10, and similarly absolute positioning of an object thereon is achieved by knowing the orientation of a single asymmetrical directional feature and the detection thereof.

It will be appreciated that the preferred embodiments described hereinabove are described by way of example only and that numerous modifications thereto, all of which fall within the scope of the present invention, exist. A non-limiting example is to fix the moving optical assembly 104 and to move the stage with the silicon wafer with respect thereto.

It will also be appreciated that the present invention is not limited to silicon wafers only. Rather, any of the embodiments described hereinabove and any modification thereof may be employed to detect a desired location of any surface having a grid and a discriminating feature in the grid junctions.

It will be appreciated by persons skilled in the art that the present invention is not limited by what has been particularly shown and described herein above. Rather the scope of the invention is defined by the claims which follow:

I claim:

1. A method for determining a location on an object, said object having on its surface an array of generally perpendicular grid lines and a plurality of asymmetrical directional features, the method comprising the steps of:
   a. positioning the object on a support which has a reference coordinate system;
   b. determining the directions of said grid lines relative to the direction of the reference coordinate system;
   c. detecting an asymmetrical directional feature, its orientation with respect to said directions of said grid lines and the distance of said asymmetrical feature from a geometrical center of said surface being known; and
   d. detecting a direction of said asymmetrical directional feature, thereby providing a location of said asymmetrical feature in said reference coordinate system; wherein said step of detecting said at least one asymmetrical directional geometrical feature comprises the steps of:
      (1) determining whether said asymmetrical feature is detected in a first location of said surface;
      (2) moving to a second location on said surface;
      (3) repeating said steps of determining whether said asymmetrical feature is detected in a first location of said surface and moving until said asymmetrical directional geometrical feature is detected, wherein for each location said asymmetrical directional feature has a different orientation with respect to the reference coordinate system.

2. A method according to claim 1 wherein in step a, the object is positioned generally with the geometrical center of the surface coinciding with the origin of the support coordinate system, thereby assuring that said detected asymmetrical geometrical feature is adjacent to said geometrical center of said surface.

3. A method according to claim 1 wherein said step d.(1) is performed in a single position in each said location prior to said moving.

4. A method according to claim 1 wherein said step d.(1) is performed in a plurality of positions in each said location prior to said moving.

5. A method according to claim 1 wherein said step b, comprises the step of employing a correlation function between a representation of the surface of said object and a representation of a reference thereto.

6. A method according to claim 5 wherein said representation of the surface of said object is a two dimensional image.

7. A method according to claim 5 wherein said representation of said reference is a one dimensional function.

8. A method according to claim 1 wherein said object is a semiconductor wafer.

9. A method according to claim 8 wherein said grid lines are scribe lines between dies of said semiconductor wafer.

10. A method for positioning an object, said object having on its surface an array of generally perpendicular grid lines and a plurality of asymmetrical directional features, the method comprising the steps of:
   a. positioning the object on a support which has a reference coordinate system;
   b. determining the directions of said grid lines relative to the direction of the reference coordinate system;
   c. detecting a directional asymmetrical feature, the distance of said asymmetrical feature from a geometrical center of said surface being known;
   d. detecting a direction of said asymmetrical directional feature, thereby providing a location of said asymmetrical feature in said reference coordinate system; and
   e. positioning said object in accordance with said provided location of said at least one asymmetrical feature; wherein said step of detecting said at least one asymmetrical directional feature comprises the steps of:
      (1) determining whether said asymmetrical directional feature is detected in a first location of said surface;
      (2) moving to a second location on said surface;
      (3) repeating said steps of determining whether said asymmetrical directional feature is detected in a first location of said surface and moving until said asymmetrical directional geometrical feature is detected, wherein for each location said asymmetrical directional feature has a different orientation with respect to the reference coordinate system.

11. A method according to claim 10 wherein in step a, the object is positioned generally with the geometrical center of the surface coinciding with the origin of the support coordinate system, thereby assuring that said detected asymmetrical geometrical feature is adjacent to said geometrical center of said surface.

12. A method according to claim 10 wherein said step e.(1) is performed in a single position in each said location prior to said moving.

13. A method according to claim 10 wherein said step e.(1) is performed in a plurality of positions in each said location prior to said moving.

14. A method according to claim 10 wherein said step b, comprises the step of employing a correlation function between a representation of the surface of said object and a representation of a reference thereto.

15. A method according to claim 14 wherein said representation of the surface of said object is a two dimensional image.

16. A method according to claim 14 wherein said representation of said reference is a one dimensional function.

17. A method according to claim 10 wherein said object is a semiconductor wafer.

18. A method according to claim 17 wherein said grid lines are scribe lines between dies of said semiconductor wafer.

* * * * *